(12) United States Patent
Hsiao

(10) Patent No.: US 7,200,078 B2
(45) Date of Patent: Apr. 3, 2007

(54) METHOD AND RELATED OPTICAL DISK ACCESSING APPARATUS FOR CALIBRATING OPTICAL DISK TILT SERVO SYSTEM ACCORDING TO NON-CONSTANT RELATION BETWEEN LOCATIONS AND TILT ANGLES OF OPTICAL DISK

(75) Inventor: Yuan-Kun Hsiao, Taipei Hsien (TW)

(73) Assignee: VIA Optical Solution, Inc., Hsin-Tien (TW)

( * ) Notice: Subject to any disclaimer, the term of this patent is extended or adjusted under 35 U.S.C. 154(b) by 385 days.

(21) Appl. No.: 10/709,030

(22) Filed: Apr. 8, 2004

(65) Prior Publication Data
US 2005/0024999 A1 Feb. 3, 2005

Related U.S. Application Data

(60) Provisional application No. 60/461,578, filed on Apr. 10, 2003.

(51) Int. Cl.
G11B 7/00 (2006.01)

(52) U.S. Cl. .............................. 369/44.32; 369/53.19; 369/53.12

(58) Field of Classification Search ............. None
See application file for complete search history.

(56) References Cited

U.S. PATENT DOCUMENTS

| 5,475,666 A | 12/1995 | Ito et al. |
| 5,689,482 A | 11/1997 | Iida |
| 6,333,902 B1 | 12/2001 | Shim |
| 6,345,023 B1 | 2/2002 | Fushimi et al. |
| 6,661,752 B2 | 12/2003 | Eom |
| 6,891,785 B2 | 5/2005 | Yamamoto et al. |
| 7,053,919 B2 | 5/2006 | Nagano |
| 2002/0131347 A1* | 9/2002 | Raaymakers ............. 369/44.32 |
| 2003/0043714 A1 | 3/2003 | Tnkeda |
| 2003/0179665 A1* | 9/2003 | Iwazawa et al. ......... 369/44.32 |
| 2004/0213119 A1 | 10/2004 | Van Vlerken et al. |
| 2005/0073923 A1 | 4/2005 | Tobita |

FOREIGN PATENT DOCUMENTS

| CN | 1373474 A | 10/2002 |
| JP | 11-353686 | 12/1999 |

* cited by examiner

*Primary Examiner*—Muhammad Edun
(74) *Attorney, Agent, or Firm*—Winston Hsu

(57) ABSTRACT

Method and apparatus for use in an optical disk tilt servo system of an optical disk drive. The tilt servo system is for adjusting an angle between a surface of an optical disk and a pick-up head of the optical disk drive. The method includes: measuring focusing results of the optical disk at multiple locations and estimating tilt angles, i.e. deviation from the horizontal, of the surface of the optical disk according to a physical model that reflects that the optical disk has different tilt angles at different locations. The tilt servo system is calibrated accordingly.

10 Claims, 18 Drawing Sheets

METHOD AND RELATED OPTICAL DISK ACCESSING APPARATUS FOR CALIBRATING OPTICAL DISK TILT SERVO SYSTEM ACCORDING TO NON-CONSTANT RELATION BETWEEN LOCATIONS AND TILT ANGLES OF OPTICAL DISK

This appl. claims benefit of 60/461,578 Apr. 10, 2003

BACKGROUND OF INVENTION

1. Field of the Invention

The present invention provides a method and related apparatus for calibrating a tilt servo system of an optical disk drive, and more particularly, a tilt servo system calibration method and related apparatus for surface bend according to a physical model showing that the optical disk has different degrees of radial tilt at different locations.

2. Description of the Prior Art

In modern information society, small, light, high-density, and low-cost optical disks have become one of the most popular non-volatile storage media. In order to access high-density optical data in an optical disk, the key development issue is how to improve precise operations of an optical disk storage device (such as optical disk drives and CD players).

Please refer to FIG. 1 and FIG. 2. FIG. 1 illustrates a block diagram of a prior art optical disk drive 10, while FIG. 2 is a lateral view diagram of the optical disk drive 10 along a sectioning-line 2—2. The optical disk drive 10 includes a control module 20, a tilt servo system 22, and related mechanical and electrical structures for data access, such as a motor 16, a track 14, a sled 12A, and a pick-up head 12B. The control module 20 controls operation of the optical disk drive 10; the motor 16 rotates an optical disk 18. The sled 12A slides along the track 14. The pick-up head 12B set on the sled 12A emits a laser beam to the optical disk 18, and can access data at different locations on the optical disk 18.

As those skilled in the art recognize, the laser beam from the pick-up head 12B should be accurately focused on the optical disk 18 for data access (including reading data from the optical disk, or writing/burning data to the optical disk). Therefore, after focusing the laser beam on a surface 24 of the optical disk 18 (see FIG. 2), the pick-up head 12B detects a laser reflection from the optical disk 18 then generates a corresponding signal which is returned to the control module 20. The control module 20 determines whether the pick-up head 12B has already focused the laser beam accurately on the optical disk 18 according to the received reflection. If the pick-up head 12B has not focused accurately, the control module 20 can control a servomechanism on the sled 12A with a servo signal Fp to fine tune the location of the pick-up head 12B up and down (along an arrow 26 in FIG. 2), so as to adjust the distance between the pick-up head 12B and the optical disk 18. After the distance between the pick-up head 12B and the surface of the optical disk 18 is adjusted, the focusing condition between the pick-up head 12B and the optical disk 18 changes accordingly, and so does the reflection received by the pick-up head 12B. Again, according to the received reflection, the control module 20 adjusts/calibrates the distance between the pick-up head 12B and the optical disk 18 with the servo signal Fp. Repeating the above focusing feedback control loop, the pick-up head 12B can finally focus on the optical disk 18 accurately. Usually, there is a fixed relationship between values of the servo signal Fp and the vertical position of the pick-up head (along the arrow 26). For example, as FIG. 2 illustrates, if the value of the servo signal Fp is equal to a standard servo signal Fs0, the pick-up head 12B can focus exactly on the surface 24 of the optical disk 18, and if the servo signal Fp is greater than the standard servo signal Fs0, the sled 12A is driven to raise the pick-up head 12B by the servo signal Fp; that is, if a location of the surface 24 is fixed, the corresponding servo signal Fp triggers the sled 12A to maintain, increase, or decrease the distance between the pick-up head 12B and the surface 24 based on whether the servo signal Fp is equal to, greater, or smaller than the servo signal Fs0. In other words, the value of the servo signal Fp corresponds to the vertical position of the pick-up head 12B.

In general, the optical disk drive 10 includes a tray or equivalent mechanism to bear the optical disk 18. In a preferred situation, the surface of the optical disk 18 should remain parallel to the pick-up head 12B for steady data access. However, in practice, owing either to blemishing of the tray, or surface bend of the optical disk 18 (or any other inferior qualities in the optical disk drive 10), an angle commonly exists between the surface of the optical disk 18 and the horizontal plane in which the pick-up head 12B moves. In this case, the optical disk drive 10 further includes a tilt servo system 22, which determines how to adjust the angle between the surface 24 and the pick-up head 12B according to the servo signal Fp provided by the control module 20. As to operations of the tilt servo system 22, please refer to FIG. 3, FIG. 4 (also FIG. 1 and FIG. 2).

FIG. 2, FIG. 3 and FIG. 4 are also lateral view diagrams of the optical disk drive 10. In FIG. 2, if the surface 24 of the optical disk 18 parallels the pick-up head 12B, a distance D between the sled 12A and the surface 24 is exactly equal to the distance D0, hence the pick-up head 12B focuses on the surface 24 accurately. FIG. 2 illustrates a horizontal projection 28 with a dotted line, which is in a plane parallel to the pick-up head 12B. As FIG. 3 illustrates, a non-zero angle exists between the surface 24 and the horizontal plane of the pick-up head 12B, i.e. the surface 24 is no longer perpendicular with respect to the focus (vertical) axis of the pick-up head. Therefore, the distance between the surface 24 and the sled 12A deviates from the distance D0 to the upper side of the horizontal 28 (as shown in FIG. 3, the disk 18 has effectively risen upward, so the distance D is greater than the distance D0). Because the surface 24 rises, the pick-up head 12B cannot focus on the optical disk accurately, and so, referring again to FIG. 3, the focusing feedback control mechanism between the pick-up head 12B and the control module 20 takes effect. The control module 20 drives the servomechanism of the sled 12A with a servo signal Fp greater than the standard servo signal Fs0, so that the pick-up head 12B rises along an arrow 27A in compensation, to the end that the pick-up head 12B can focus accurately on the surface 24 once more.

Moreover, the tilt servo system 22 also monitors the servo signal Fp provided by the control module 20. If the servo signal Fp is greater than the standard servo signal Fs0, the tilt servo system 22 determines the surface 24 has already deviated from the horizontal 28, because the control module 20 has increased the servo signal Fp in order to re-focus the pick-up head 12B on the surface 24. In this situation, the tilt servo system 22 starts adjusting the angle between the optical disk 18 and the pick-up head 12B. As FIG. 4 illustrates, in accordance with the servo signal Fp, the tilt servo system 22 lowers the optical disk 18 along the arrow 27C, which effectively lowers the surface 24 toward its original vertical position above the pick-up head 12B. While the tilt servo system 22 adjusts the tilt of the optical disk 18, the focusing feedback control mechanism between the control module 20 and the pick-up head 12B decreases the servo signal Fp gradually until the surface 24 returns to the horizontal 28. As a result, the distance D between the surface 24 and the sled 12A returns to a value equal to the distance D0, and the servo signal Fp from a value greater than the standard servo signal Fs0 in FIG. 3, descends to a level almost equal to the standard servo signal Fs0. At the same time, by monitoring the servo signal Fp continually, the tilt servo system 22 determines whether tilt servo operation has been completed, that is, whether the surface 24 is once more coincident to the horizontal 28. Hence, the tilt servo system 22 finishes adjusting tilt angle. In conclusion, the tilt servo system 22 adjusts the tilt angle of the tray with the servo-mechanism, or equivalently changes the vertical position relationship between the optical disk 18 (and hence the surface 24) and the pick-up head 12B.

From the above-mentioned descriptions, during accessing data stored on the optical disk 18, according to the difference between the servo signal Fp and the standard servo signal Fs0, the tilt servo system 22 adjusts the distance between the optical disk 18 and the pick-up head 12B until the servo signal Fp is equal to the standard servo signal Fs0. Because operations of the tilt servo system 22 are based on the standard servo signal Fs0, measurement and calibration of the standard servo signal Fs0 becomes a key point.

In order to set the standard servo signal Fs0 for the tilt servo system 22, the optical disk drive 10 goes through special steps before the tilt servo system 22 is enabled. Please refer to FIG. 5 (also FIG. 1 and FIG. 2) illustrating a prior art process 100, which shows a process of the optical disk drive 10 in FIG. 1 calibrating the tilt servo system 22. Process 100 includes the following steps:

- step 102: start calibration of the tilt servo system 22. (Process 100 includes calibrating and setting the standard servo signal Fs0 for the tilt servo system 22 before data is accessed, but after a disk is inserted into the optical disk drive 10. As mentioned above, both blemishes/irregularities of the optical disk drive (or other support devices for the optical disk 18) and surface bend of the optical disk 18 cause tilt and vertical deviation of the surface 24, so that when inserting a disk, the standard servo signal Fs0 of the tilt servo system 22 may be in error and should ideally be calibrated after the tilt servo).
- step 104: the sled 12A carrying the pick-up head 12B seeks two different locations, P0 and P1, along the track 14 (please refer to FIG. 2), where the focusing feedback control mechanism between the pick-up head 12B and the control module 20 is engaged. As mentioned above, the focusing feedback control mechanism adjusts value of the servo signal Fp, so as to move the pick-up head 12B up and down for accurate focus on the surface 24. Additionally, owing to the fixed focus point of the pick-up head 12B, the vertical position of the pick-up head 12B will correspond to any undulation of the surface 24 and the servo signal Fp should change accordingly. Therefore, the value of the servo signal Fp at the locations P0 and P1 represent any undulation of the surface 24 (or deviation from the horizontal). Therefore, the greater the difference in the servo signal Fp between the locations P0 and P1, the more deviation from the horizontal there is in the optical disk 18. Taking the values of the servo signal Fp at the locations P0 and P1, the prior art process 100 calibrates tilt of the surface 24.
- step 106: according to an assumption that a surface is a perfect plane, process 100 estimates the overall tilt angle of the surface 24 away from the horizontal 28 based on the difference in vertical height between the locations P0 and P1. After that, process 100 determines a compensating amount required for the surface 24 to be returned to the horizontal 28.
- step 108: according to the compensating amount in step 106, the tilt servo system 22 adjusts the optical disk 18, so as to return the surface 24 to the horizontal 28.
- step 110: the sled 12A carrying the pick-up head 12B seeks the location P0 again and the focusing feedback control mechanism acts to find focus. The resulting value of the servo signal Fp corresponding to the location P0 is set as the standard servo signal Fs0. Therefore, the process 100 finishes setting the standard servo signal Fs0. As FIG. 2, FIG. 3, and FIG. 4 illustrate, the servo signal Fp should be equal to the standard servo signal Fs0 if the surface 24 is horizontal. Furthermore, the function of the tilt servo system 22 is to maintain a minimum differential between the servo signal Fp and the standard servo signal Fs0, or equivalently to maintain the disposition of the surface 24 in the horizontal plane. Since the prior art process 100 calibrates and adjusts the tilt angle under the assumption that optical disks are perfect planes, the surface 24 should be horizontal after step 108 where the servo signal Fp is taken as the standard servo signal Fs0.
- step 112: after setting the standard servo signal Fs0, the tilt servo system 22 acts with reference to the standard servo signal Fs0.
- step 114: finish process 100. The optical disk drive 10 starts accessing the optical disk 18, while the tilt servo system 22 continues to adjust tilt angle, so that the servo signal Fp is always close to the standard servo signal Fs0 set in step 110.

To further illustrate the prior art process 100, please refer to FIG. 6, FIG. 7, and FIG. 8, which continue on from FIG. 1 to FIG. 4. As mentioned above, owing to blemishes/irregularity of the mechanism or the surface, the surface 24 of the optical disk 18 is not parallel to the horizontal 28, which means the optical drive 10 should undergo process 100 first. Initially, as FIG. 6 illustrates, the sled 12A seeks the location P0 where the servo signal Fp provided by the focusing feedback control mechanism is hypothetically equal to a signal f0. Moreover, the distance between the surface 24 and the horizontal 28 at the location P0 is hypothetically equal to a distance Yp0 (or equivalently a distance between the surface 24 and the sled 12A). Then, in FIG. 7, the sled 12A moves to another location P1, a distance DX0 apart from the location P0, where the servo signal Fp is hypothetically equal to a signal f1, which corresponds to the distance between the surface 24 and the sled 12A at the location P1 (or a distance Yp1). As FIG. 6 and FIG. 7 illustrate, since the distance Yp1 is greater than the distance Yp0, the control module 20 applies a greater servo signal Fp to the pick-up head 12B in the location P1 for accurate focus. In brief, the difference in servo signal Fp between the locations P1 and P0 (also the signals f1 and f0) corresponds to the difference in vertical height of the surface 24 between the locations P1 and P0 (also the difference between distances Yp1 and Yp0).

After calibrating tilt angle in step 104, process 100 estimates overall tilt angle of the surface 24 based on the assumption that the surface is a perfect plane in, step 106. As the inset graph 7A in FIG. 7 illustrates, since the distance between the locations P0 and P1 is the distance DX0, and difference in vertical height of the surface 18 between the locations P0 and P1 is a distance DY0 (=Yp1−Yp0), an angle A1 between the surface 24 and the horizontal 28 can be calculated. Under the assumption that the surface 24 is a perfect plane, the tilt servo system 22 compensates according to the angle A1 in step 108. Continuing on from FIG. 6 and FIG. 7, in FIG. 8, the tilt servo system 22 compensates according to the angle A1 along the arrow 27C in step 108 (wherein a dotted line 25 represents the position of the optical disk 18 in FIG. 6 and FIG. 7). Therefore, if the surface 24 of the optical disk 18 is indeed a perfect plane, the surface 24 should be parallel to the horizontal 28 after compensation. Then, in step 110, the sled 12A returns to the location P0, while the current servo signal Fp provided by the focusing feedback control mechanism is set for the standard servo signal Fs0. As a result, the tilt servo system 22 starts to act (step 112), and finishes calibration (step 114), so as to facilitate accessing of the optical disk 18.

As mentioned above, the calibration provided by the tilt servo system in the prior art process 100 is carried out under the assumption that the surface of the optical disk is a perfect plane. However, in practice, the surfaces of optical disks are not perfect planes, but may be subject to slight bending or 'dishing', the extent of which cannot be seen by the naked eye (in the order of micrometers). In the process of high-precision data access, optical disk bend can cause many negative effects. More especially in that the presence of bending undermines the assumption that the surface is a perfect plane, the prior art process 100 fails to calibrate the correct standard servo signal, to the end that the tilt servo system cannot access data properly. Please refer to FIG. 9 and FIG. 10 for details. Continuing from FIG. 2 to FIG. 4 and FIG. 6 to FIG. 8, FIG. 9 and FIG. 10 are also lateral view diagrams.

FIG. 9 and FIG. 10 show exaggerated bending of the surface 24 for convenience. It can be seen that different locations on the surface may have varying degrees of tilt. As FIG. 9 illustrates, a point P is a hypothetical fulcrum when the tilt servo system 22 calibrates the surface 24. Additionally, vertical lines through the locations P0 and P1 intersect the surface 24 at points Pa0 and Pa1, and a horizontal line projected from the point Pa0 intersects the vertical line passing through the point Pa1 at a point Pa01. Furthermore, an included angle exists between a line from the point Pa0 to the point P and the horizontal 28, while another included angle A1 exists between a line from the point Pa1 to the point Pa0 and a line from the point Pa0 to the point Pa01 (see FIG. 9 or its inset graph 9A). Because the surface 24 is not a perfect plane, the angle A is not equal to the angle A1. As a result, in step 106, the prior art process 100 can only estimate the angle A1 with the distances DX0 and DY0, but not the angle A. That is, the prior art process 100 can only estimate the included angle of surface bend between two points and cannot compensate for variations in included angle across the wider data area of the optical disk 18.

FIG. 10 (and its inset graph 10A) illustrates calibration error when adjusting for surface bend in step 108. As the prior art process 100 compensates according to the angle A1 along the arrow 27C in step 108, only the line from the point Pa0 to the point Pa1 is parallel to the horizontal 28, while an included angle (A-A1) still exists between the line from the point P to the point Pa0 and the horizontal 28. In other words, when the pick-up head 12B again calibrates the servo signal Fp at the location P0 in step 110, the surface 24 still deviates from the horizontal 28. Therefore, as FIG. 10 illustrates, a calibration error occurs, which means that the surface 24 near the location P0 (or near the point Pa0) is not horizontal. If, in subsequent operations, the tilt servo system 22 always takes this standard servo signal Fs0 as a reference, the tilt servo system 22 will not operate properly and neither will the focusing feedback control mechanism.

In summary, since the prior art process 100 in FIG. 5 is based on the assumption that the surface is a perfect plane, the prior art technique relies on readings from only two locations for the whole surface tilt estimation. However, the surfaces of optical disks are generally bent or dished to some degree and in such a way that their surfaces have different degrees of tilt at different locations. That is, the prior art process 100 cannot derive a correct standard servo signal, with the result that the tilt servo system 22 cannot adjust the tilt surface precisely. Consequently, the optical disk drive 10 may suffer from degradation of data read-back signals.

SUMMARY OF INVENTION

It is therefore a primary objective of the claimed invention to provide a calibration method and related apparatus of the tilt servo system to compensate for optical disk bend.

According to the claimed invention, an optical disk drive can focus a laser beam on an optical disk and receive a reflection, and a method and apparatus for calibrating the optical disk tilt servo system of an optical disk drive includes:

First, setting a standard location and at least two calibration locations, the standard location and the calibration locations corresponding to different parts of the optical disk.

Second, calibrating a focusing condition of the optical disk in the optical disk drive in order to generate a corresponding focusing result in the standard location and the calibration locations.

Third, calculating different focusing results between each calibration location and the standard location. According to the different focusing results, estimating corresponding tilt angles between the surface of the optical disk and the calibration locations.

Finally, determining whether the tilt angles corresponding to each of the calibration locations on the surface of the optical disk are equal.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
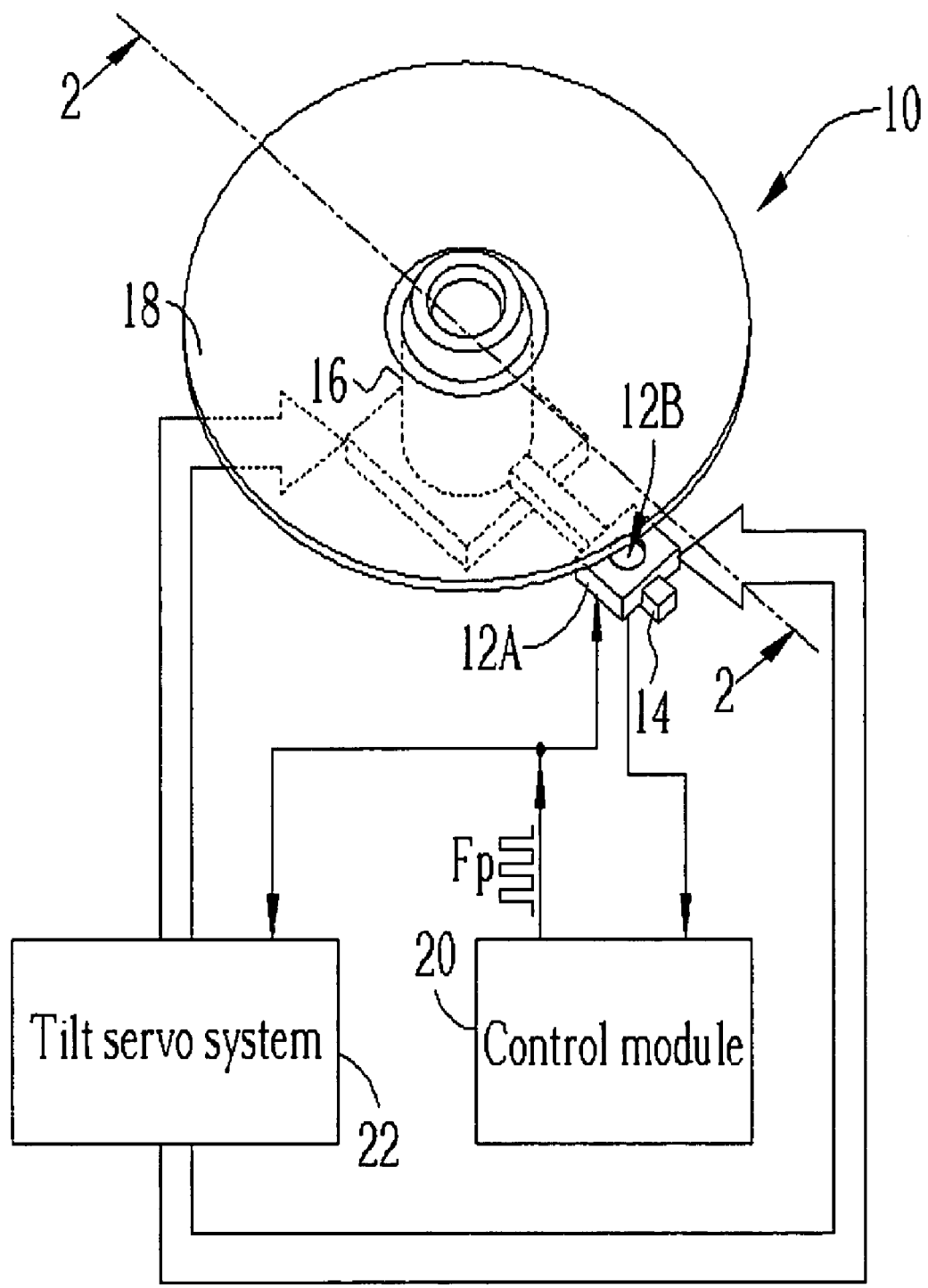
FIG. 1 illustrates a block diagram of a prior art optical disk drive.
Figure 2:
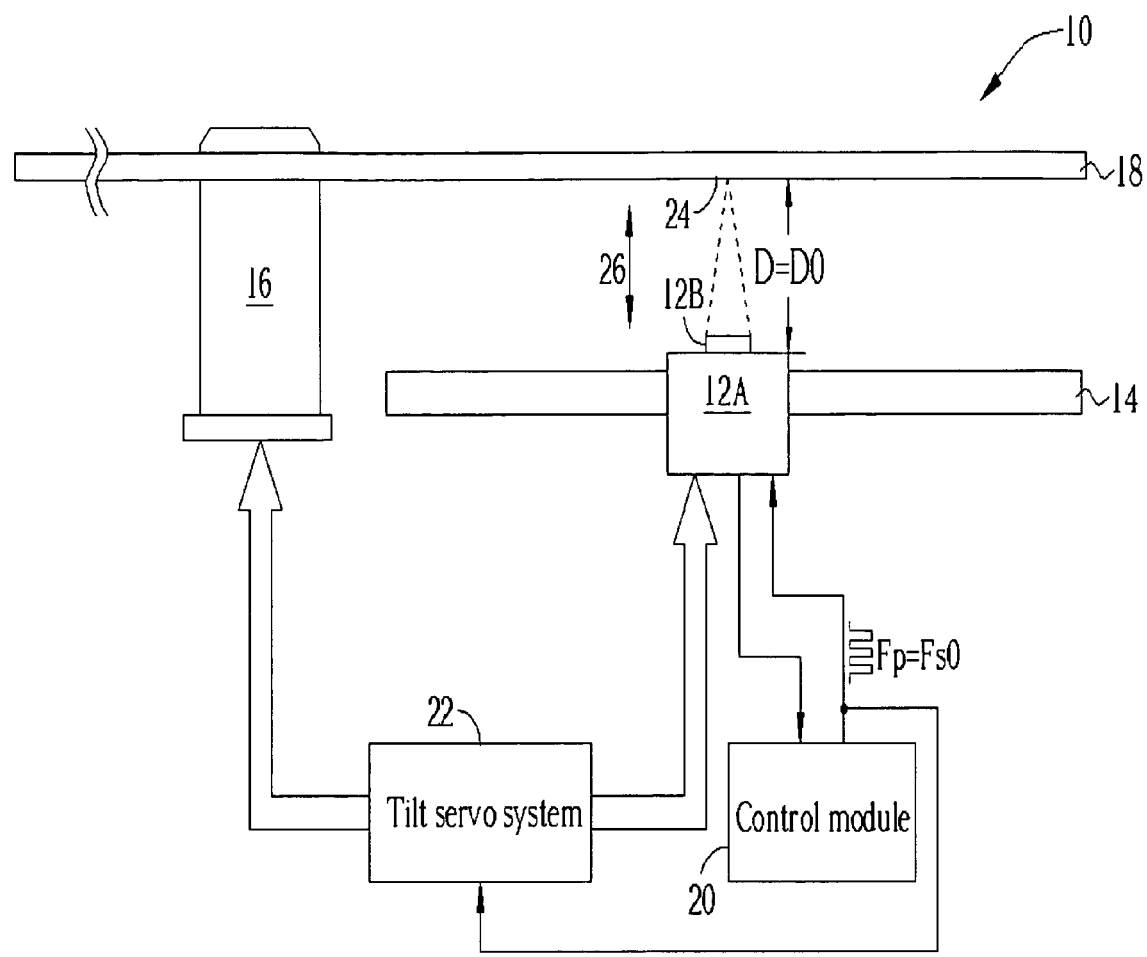
FIG. 2 illustrates a lateral view diagram of the optical disk drive in FIG. 1.
Figure 3:
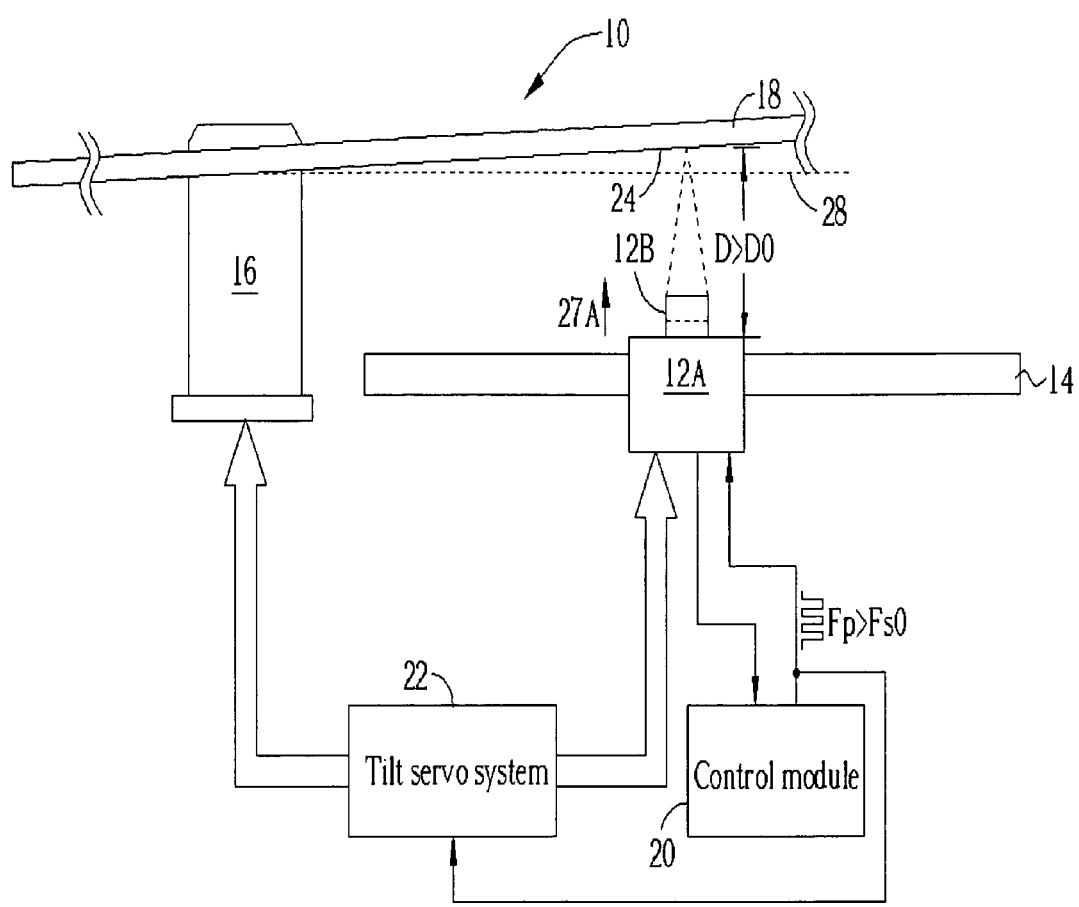
FIG. 3 and FIG. 4 illustrate schematic diagrams of the optical disk drive in FIG. 1 during tilt servo system operation.
Figure 4:
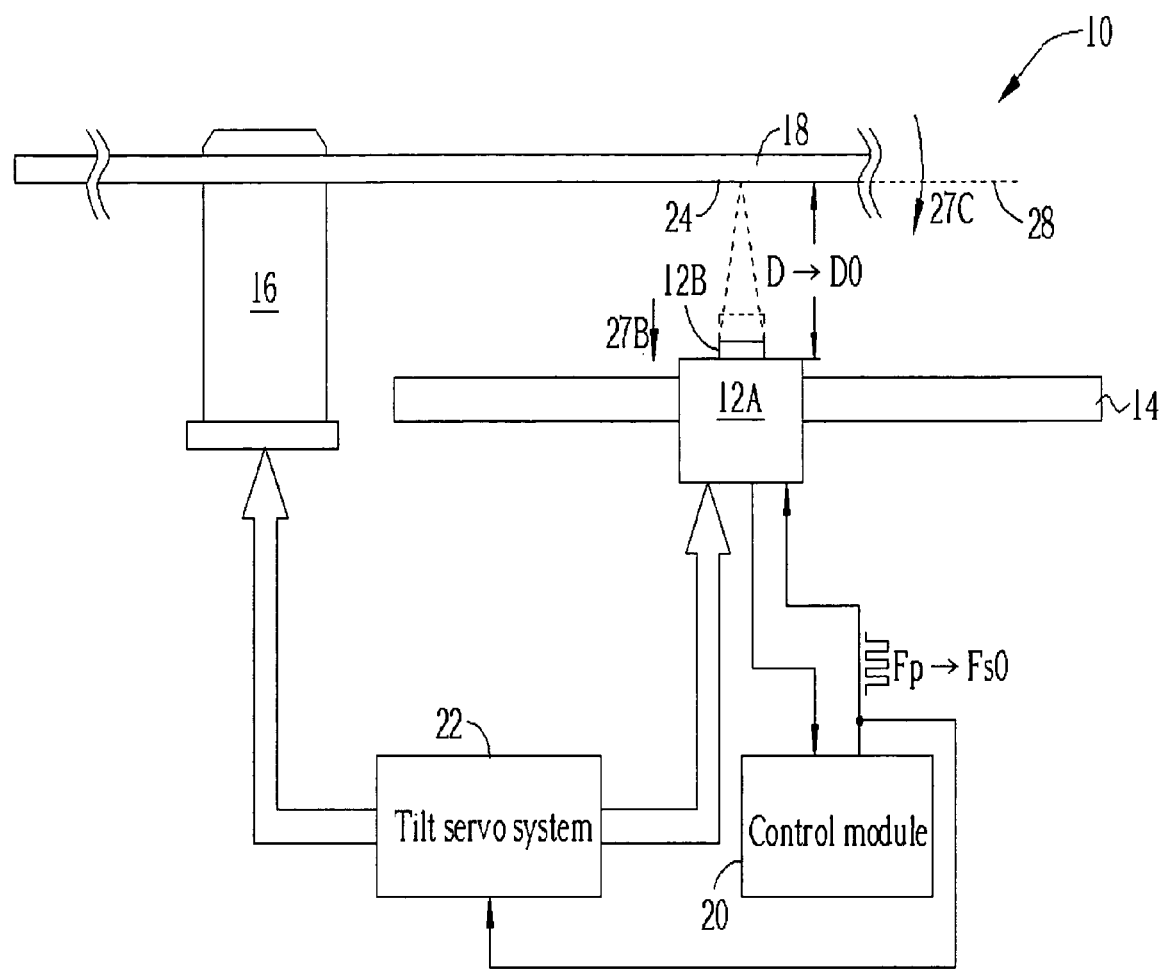
Figure 5:
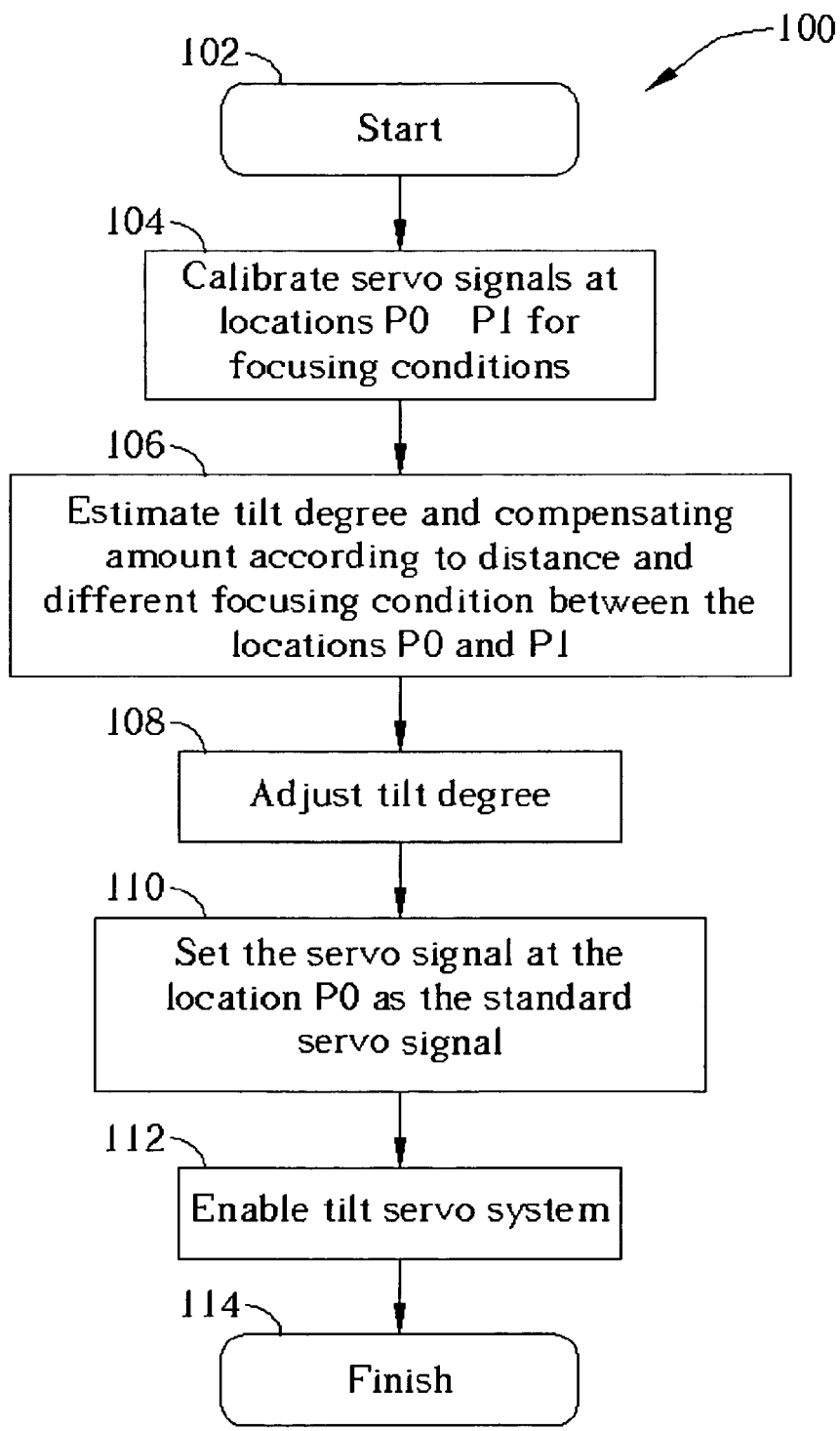
FIG. 5 illustrates a flowchart of the prior art calibration process of the optical disk drive in FIG. 1.
Figure 6:
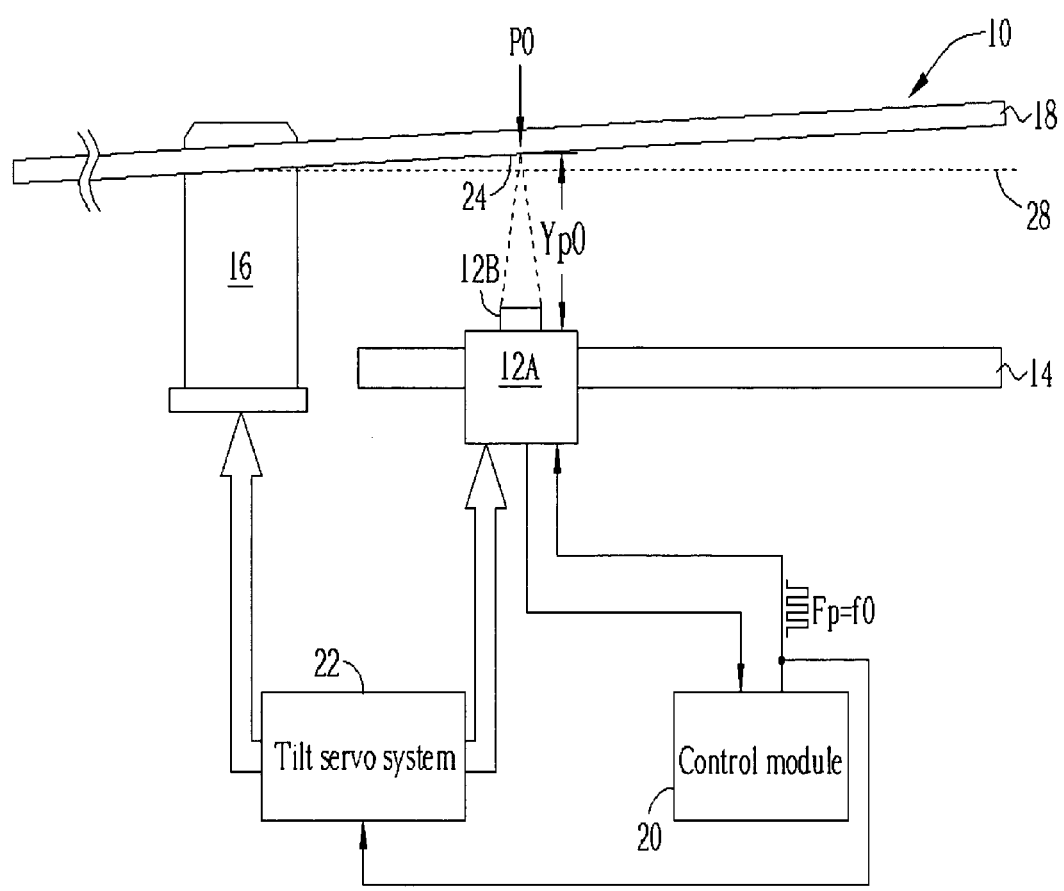
FIG. 6, FIG. 7, and FIG. 8 illustrate schematic diagrams of the optical disk drive in FIG. 1 during the calibration process in FIG. 5.
Figure 7:
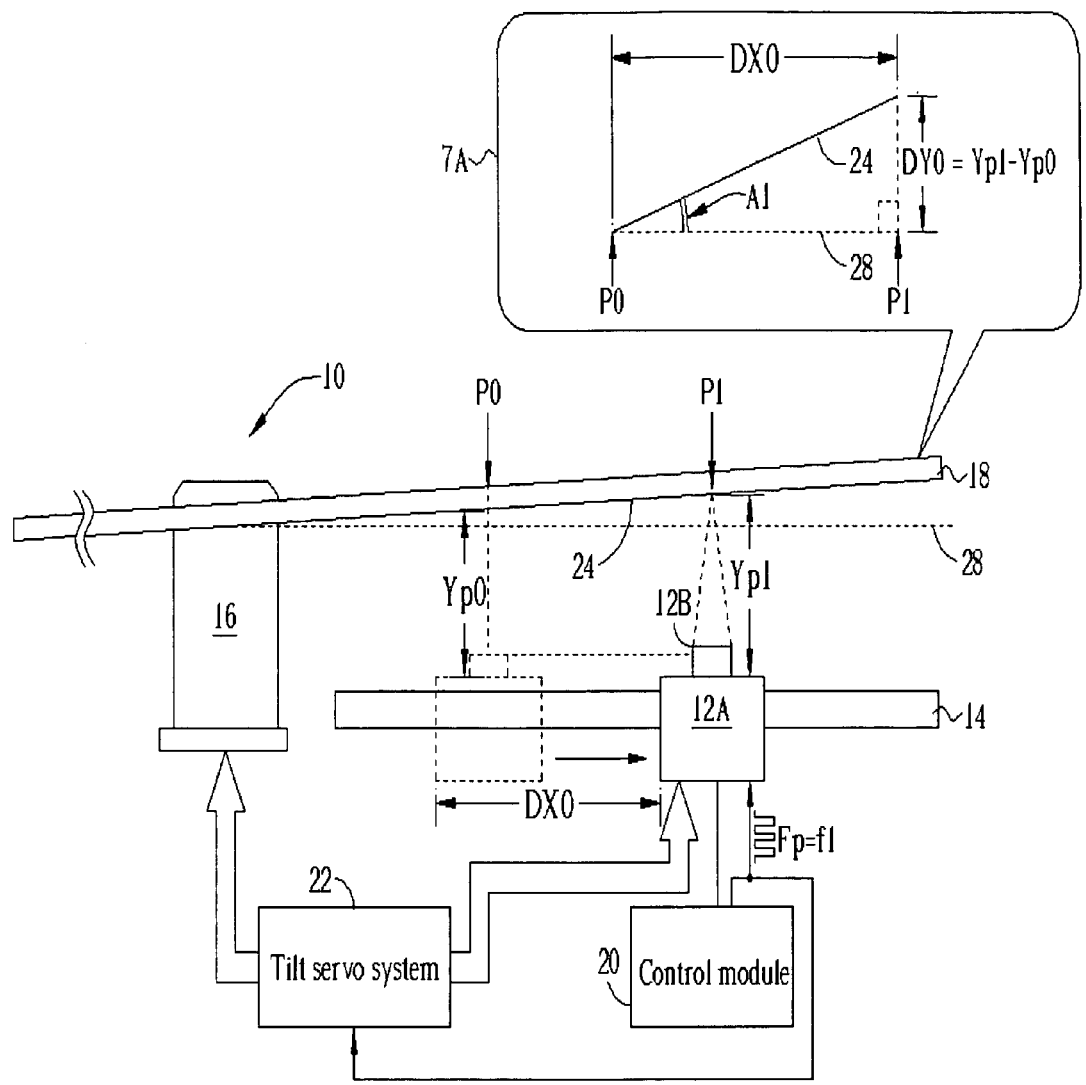
Figure 8:
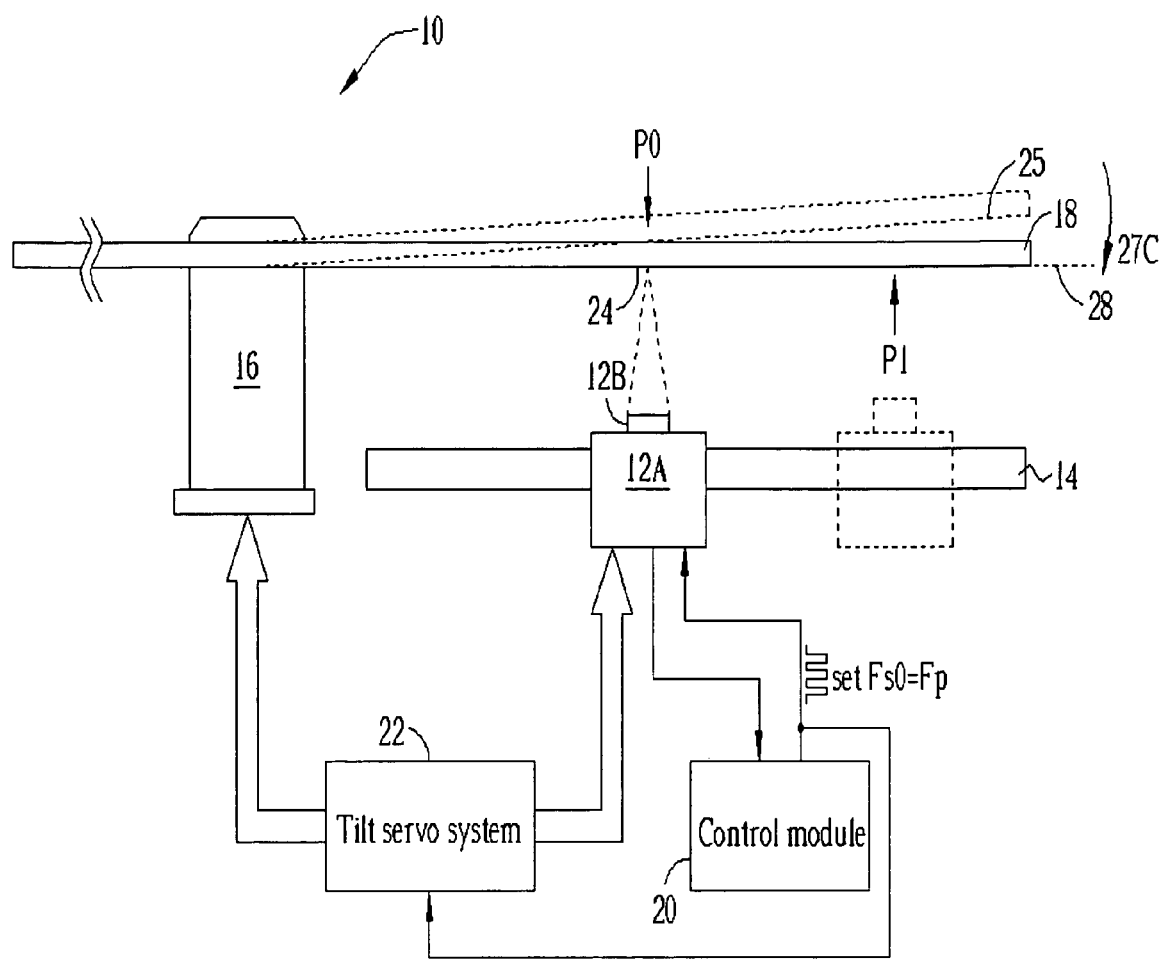
Figure 9:
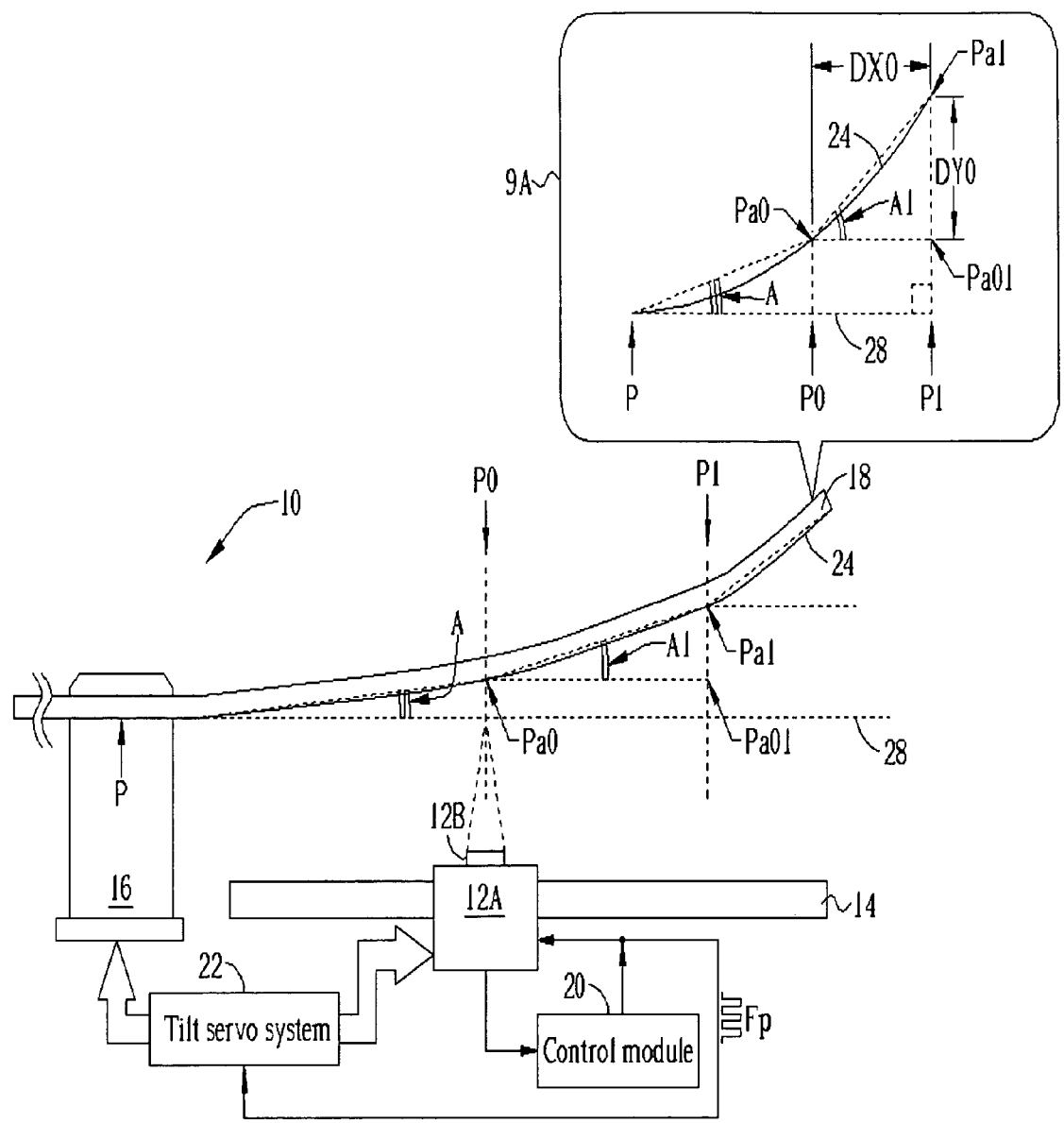
FIG. 9 and FIG. 10 illustrate schematic diagrams of the optical disk drive in FIG. 1 during the process in FIG. 5 for a surface bend.
Figure 10:
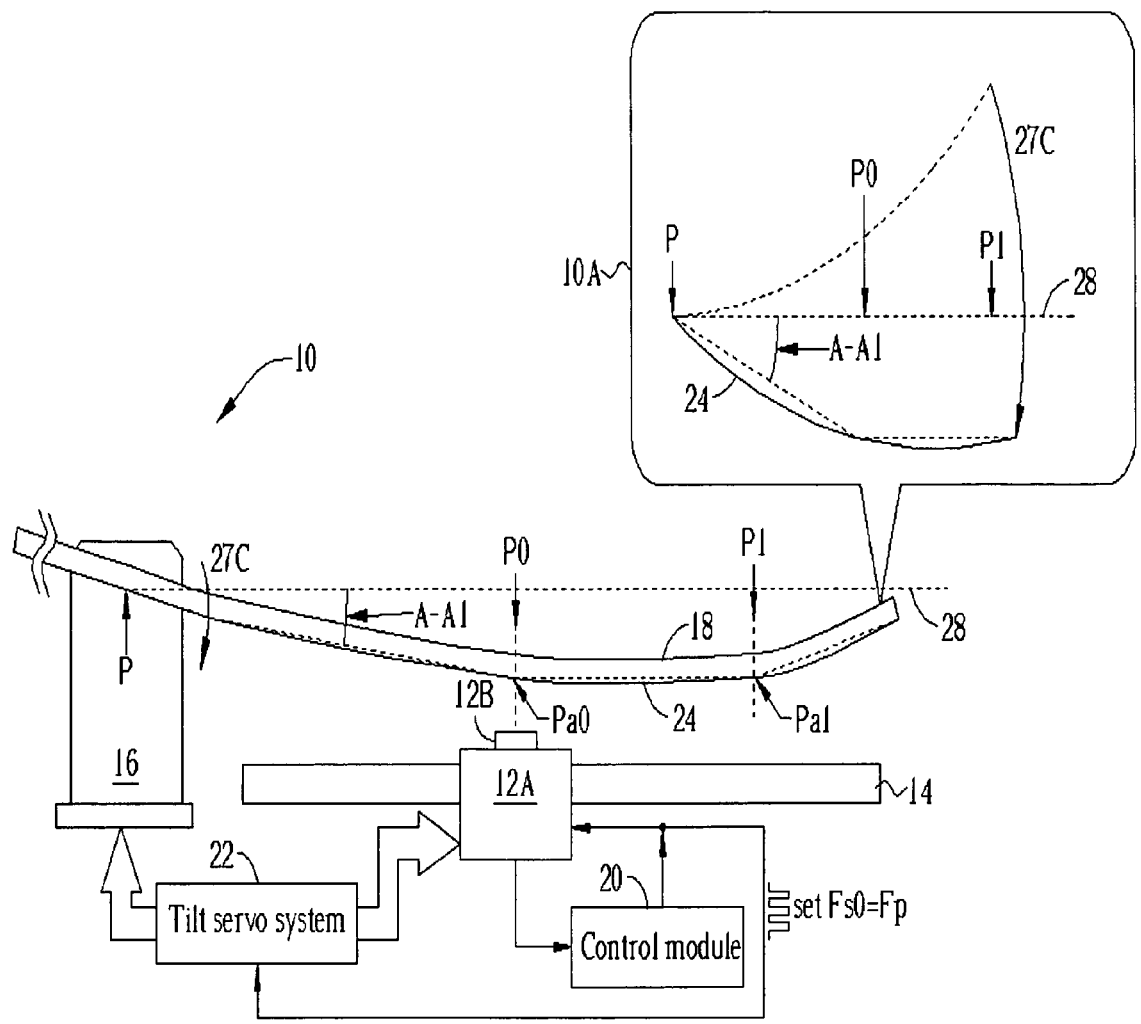
Figure 11:
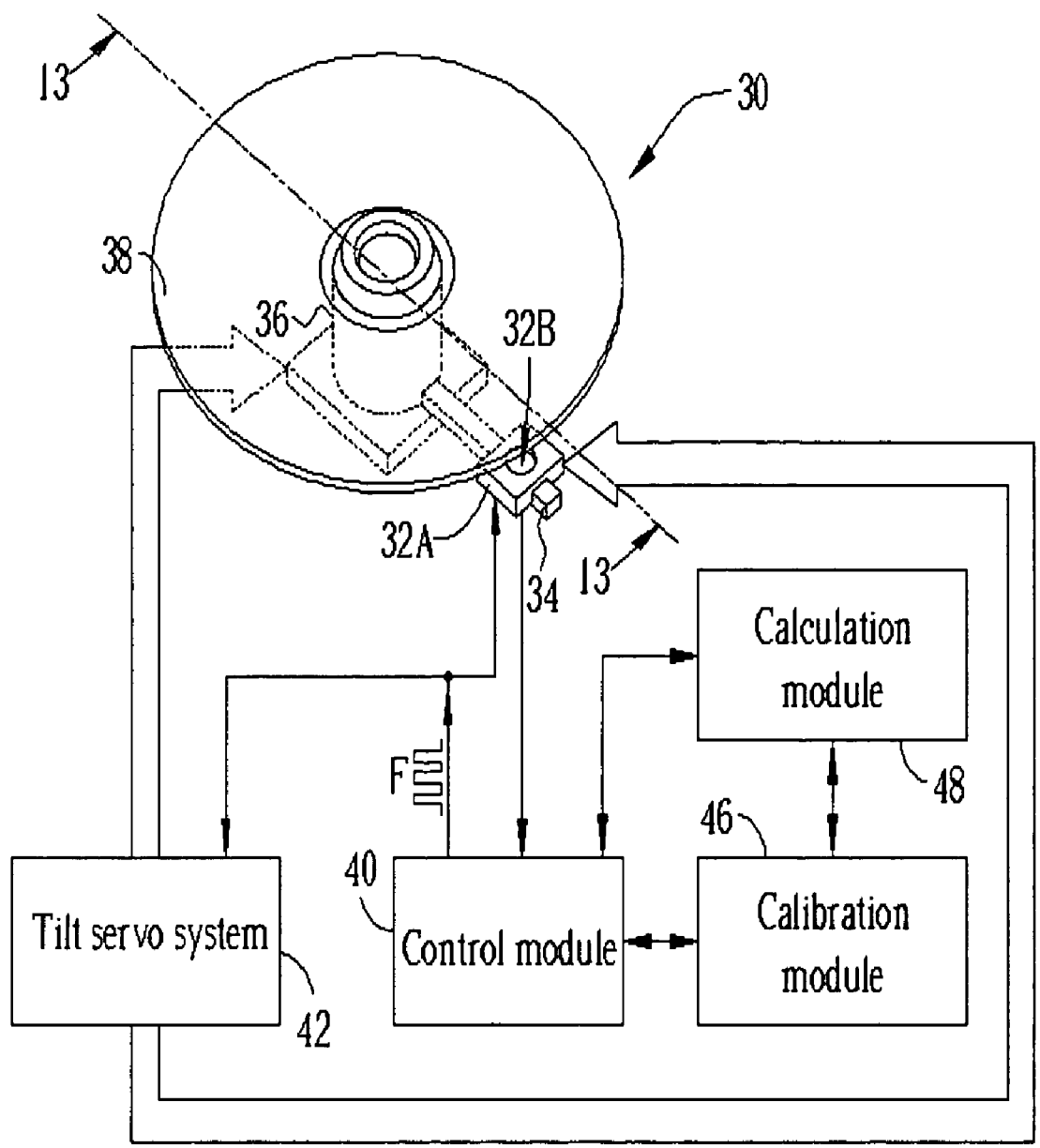
FIG. 11 illustrates a block diagram of the present invention, an optical disk drive.

Please refer to FIG. 11 illustrating a block diagram of a present invention optical disk drive 30. The optical disk drive 30 includes a sled 32A, a pick-up head 32B, a track 34, a motor 36, a control module 40, a tilt servo system 42, a calculation module 48, and a calibration module 46. The motor 36 rotates an optical disk 38; the sled 32A slides along the track 34, which carries the pick-up head 32B to emit a laser beam to the optical disk 38. While the sled 32A leads the pick-up head 32B to slide along the track 14, the pick-up head 32B can access data stored on the optical disk 38. The control module 40 controls the operation of the optical disk drive 30. After focusing the laser beam on the optical disk 38, the pick-up head 32B detects a reflection from the optical disk 38, and then generates a corresponding signal back to the control module 40, so as to determine focusing condition. Moreover, the control module 40 triggers a servo-mechanism of the sled 32A with a servo signal F for moving the pick-up head 32B up and down, so that the pick-up head 32B can maintain precise focusing on the surface. For that reason, a focusing feedback control mechanism is included between the pick-up head 32B and the control module 40. Similar to the optical disk drive 10 in FIG. 1, the optical disk drive 30 in FIG. 11 also includes a tilt servo system 42, which can adjust the tilt angle between the optical disk 38 and the pick-up head 32B based on the servo signal F provided by the control module 40. Similar to the prior art, the tilt servo system 42 is also referenced to a standard servo signal for determining tilt angle, therefore, before the tilt servo system 42 commences operation, the optical disk drive 30 undergoes a calibration process for setting the value of the standard servo signal.

In order to overcome the calibration errors inherent in the prior art process, the present invention adopts a physical model for surface bend. That is, the calibration module 46 sets a standard location and at least two calibration locations according to the physical model (which means there are at least three different locations to be calibrated, and the number of these locations is determined by the physical model). The control module 40 controls the sled 32A to move the pick-up head 32B to these locations where each instance of servo signal F provided by the focusing feedback control mechanism, is used to estimate the tilt angle of the surface. Meanwhile, the calculation module 48 calculates related parameters of the physical model, so as to calibrate the tilt angle of surface bend at different locations. Therefore, the tilt servo system 42 can adjust/correct the tilt of an optical disk 38 based on the tilt angle at different locations, i.e. in accordance with the physical model, so that the servo signal of the standard location can be set at a level suitable for surface bend.

Figure 12:
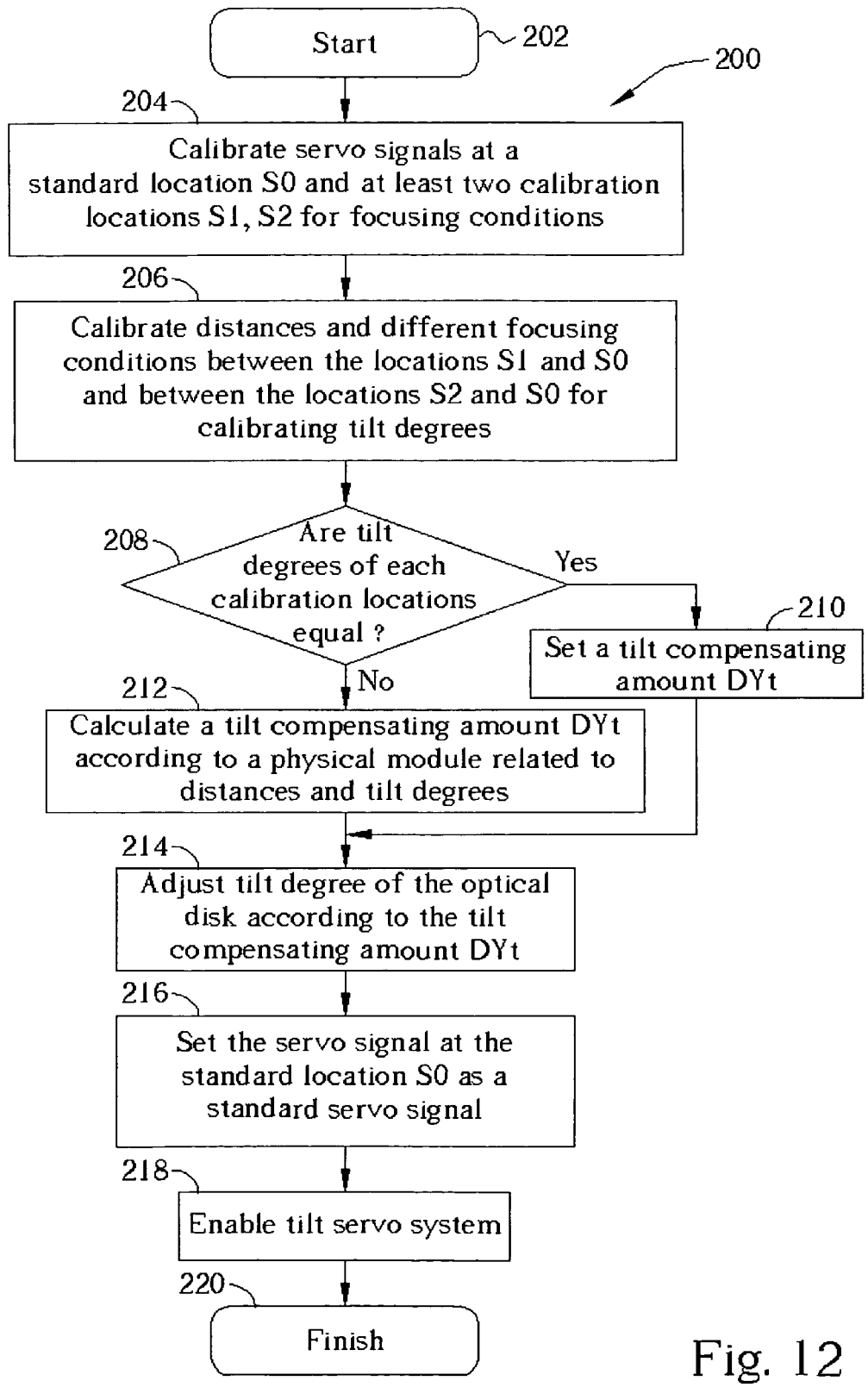
FIG. 12 illustrates a flowchart of the optical disk drive calibration process in FIG. 11.

Please refer to FIG. 12 (also FIG. 11), which illustrates a calibration process 200 when the optical disk drive 30 calibrates the tilt servo system. The process 200 includes the following steps:

step 202: start the calibration process 200 (which begins before data is accessed, but after an optical disk 30 is inserted).

step 204: setting a standard location S0 and at least two calibration locations S1, S2. The sled 32A moves to these locations where the focusing feedback control mechanism sets each servo signal F. The focusing feedback control mechanism triggers the servo signals F to move the sled 32A in the vertical sense, so as to adjust/maintain distance between the pick-up head 32B and the surface of the optical disk. Therefore, each servo signal corresponding to each location represents undulation of the surface. In other words, taking these servo signals as indications of disk bend allows the estimation of tilt angle in the above locations.

step 206: taking into account the different distances and focusing results between each calibration location and the standard location S0, tilt angle at each calibration location can be determined. For example, distance between the n'th location Sn (n=1, 2, . . . , according to the index number of the calibration location) and the standard location S0 is DXn. Additionally, a difference in vertical height DYn between the calibration location Sn and the standard location S0 will correspond to different servo signals F. Then, a quantity DYn/DXn represents tilt angle at the location Sn on the optical disk 38. As a result, by calculating DYn/DXn for each of the calibration locations Sn, variations in tilt angle across the optical disk 38 can be estimated and mapped.

step 208: comparison of tilt angle at each calibration location. If equal, the optical disk 38 is a perfect plane, so the process 200 skips to step 210, or otherwise carries out step 212.

step 210: calculating a compensating amount DYt based on a physical model that represents the surface as a perfect plane. That is, process 200 determines what value of a servo signal F should be at the specified calibration location Sn so that the tilt servo system 42 can compensate the standard location S0 thus returning an optical disc 18 to an estimation of the horizontal. Subsequently, the process 200 skips to step 214.

step 212: calculating a compensating amount DYt based on a physical model that the surface is bent. Such bending displays a non-linear relationship of distance versus tilt angle. That is, this model corresponding to surface bend is based on the fact that the tilt angle of the surface changes between different locations. For example, the present invention adopts a polynomial physical model, whose parameters (like parameters in a polynomial) are obtained from tilt angles corresponding to each calibration location Sn (details will be shown later). After obtaining the parameters, the physical model can almost match the surface bend profile, so that process 200 can estimate the tilt angle of the standard location S0, or equivalently a (tilt) compensating amount DYt, which is similarly an amount for the specified calibration location to compensate the standard location S0 in order to position S0 at an estimate of the horizontal. Subsequently, process 200 progresses to step 214.

step 214: adjusting the optical disk 38 with the compensating amount DYt, while the function of the compensating amount DYt in steps 210 and 212 is the same, but the physical models are not (one is for a perfect plane, the other is for a bent surface). In this step, the sled 32A carrying the pick-up head 32B moves to some specified calibration location, Sn, where the tilt servo system 42 adjusts the optical disk 38 until the servo signal F of the specified location Sn corresponds to the compensating amount DYt. As a result, the surface near the standard location S0 on the optical disk 38 should be adjusted to the horizontal. In brief, after constructing the physical model in step 212 (or 210), the present invention process 200 is able to adjust the bent surface to an estimation of the horizontal.

step 216: the sled 32A moves to the standard location S0 where the focusing feedback control mechanism operates and sets the current servo signal F as the standard servo signal. Hence, the tilt servo system 42 finishes calibrating the standard servo signal.

step 218: process 200 enables the tilt servo system 42 to adjust the surface with the standard servo signal during data access, so as to maintain servo signals close to the standard servo signal.

step 220: finish the calibration process 200. The optical disk drive 30 starts accessing the optical disk 38.

Figure 13:
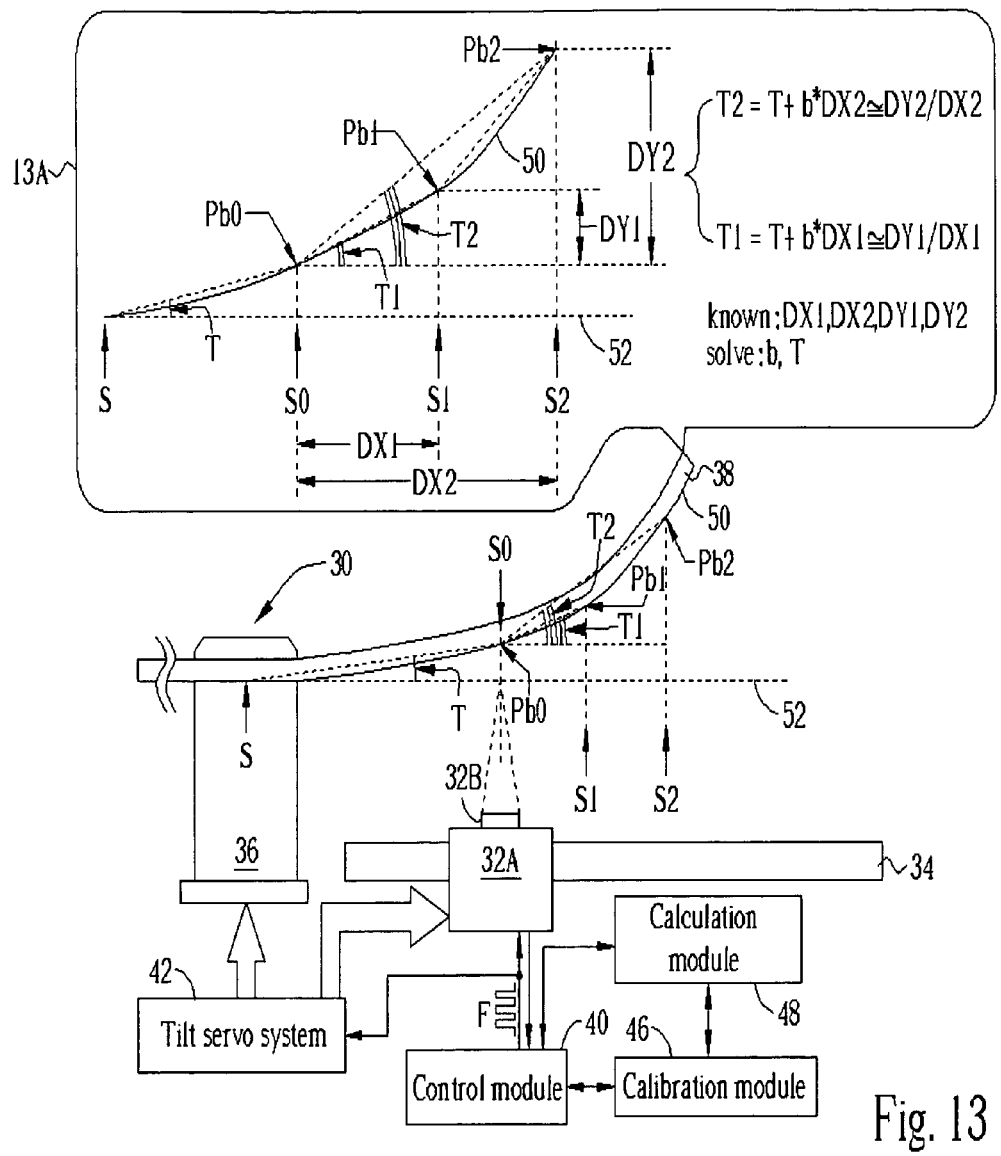
FIG. 13 and FIG. 14 illustrate schematic diagrams of the optical disk drive in FIG. 11 during the calibration process in FIG. 12.

To further illustrate the present invention process 200, please refer to FIG. 13 (also FIG. 11), which illustrates a lateral view diagram along a sectioning line 13—13 in FIG. 11. In order to fit the surface bend, the physical model in FIG. 13 is based on an embodiment that treats the variation in tilt angle of the surface versus distance as a linear polynomial. In this embodiment, after process 200 starts in step 202, in step 204, the sled 32A carrying the pick-up head 32B moves to the standard location S0 and two calibration locations S1 and S2, where the focusing feedback control mechanism operates for three corresponding servo signals F. Additionally, the focusing feedback control mechanism can adjust the servo signal F for the pick-up head 32B to accurately focus on the surface 50, so that the servo signals F represents surface 50 undulation in the calibration locations. As FIG. 13 (and its inset graph 13A) illustrates, in step 206, the calculation module 48 is able to calculate different vertical distances DY1 and DY2 by calculating different servo signals F between the locations S1 and S0, and between the locations S2 and S0. Moreover, lines through the locations S0, S1, and S2, being perpendicular to a horizontal 52 parallel with the pick-up head 32B, intersect the surface 50 at points Pb0, Pb1, and Pb2, so that distances DY1 and DY2 represent different vertical distances between the points Pb1 and Pb0, and between the points Pb2 and Pb0. In addition, distances DX1 and DX2 represent horizontal distances between the locations S1 and S0, and between the locations S2 and S0, which can be calculated by measuring corresponding distances between locations on the track 34. Also, a point S in FIG. 13 (and inset graph 13A) is a hypothetical fulcrum when the tilt servo system 42 adjusts the surface 50. Therefore, an included angle T between a line from the point S to the point Pb0 and a line of the horizontal 52, represents the tilt angle of the surface 50 in the standard location S0.

According to the different vertical distances DY1, DY2 and the distances DX1, DX2, the calculation module 48 is able to estimate tilt angles corresponding to the calibration locations S1 and S2 in step 206. An angle T1 between the line Pb1 to Pb0 and the horizontal 52 represents a tilt angle corresponding to the calibration location S1, while an angle T2 between the line Pb2 to Pb0 represents a tilt angle corresponding to the calibration location S2. Since the different vertical distances (such as DY1 and DY2) should be much smaller than the horizontal distances (DX1 and DX2), the angles T1 and T2 can be DY1/DX1 and DY2/DX2, so process 200 determines whether DY1/DX1 is equal to DY2/DX2 in step 208 (or whether the difference between DY1/DX1 and DY2/DX2 is smaller than a threshold value). If true, the angle T1 is (almost) equal to the angle T2. Therefore, the surface 50 can be regarded as a perfect plane, to the end that process 200 proceeds to step 210. Contrarily, if false, the surface 50 is regarded as having surface bend as FIG. 13 illustrates, with the result that process 200 proceeds to step 212 instead, where parameters of the physical model are calculated for simulating the surface bend 52.

As the inset graph 13A illustrates, the embodiment of the present invention in FIG. 13 represents a surface bend with the physical model including a linear relationship between tilt angle and distance, which can be: $Tn=T+b*DXn$ (for n=1,2), where the angle Tn is the tilt angle of a calibration location Sn, angle T is the tilt angle of a standard location S0, the distance DXn is the distance between the locations Sn and S0, and the parameter b is a constant. In this case, the angle T and the parameter b are unknown, but the angles T1 and T2 can be obtained from DY1/DX1 and DY2/DX2. As a result, a system of two equations (as graph 13A illustrates) can be used to calculate the parameter b and the angle T. In other words, because there are two unknown parameters in the formula, the embodiment in FIG. 13 needs to calibrate tilt angle in two calibration locations, so as to construct the system of two equations, and then solve them. Certainly, process 200 can further include other locations for calibration, which can construct redundant systems of equations so as to solve the parameters b and T with the least-square error method.

After solving the system of equations, the physical model can simulate the surface 50 bend. At the same time, by calculating the angle T, a compensating amount DYt corresponding to the standard location can be obtained. In the implementation of process 200, a compensating amount DYt can be obtained by calculation at the calibration location S1, that is: if the servo signal F of the location S1 corresponds to the compensating amount DYt, the tilt servo system 42 can simply adjust the location S0 to horizontal. Therefore, in step 214, the sled 32A moves to the location S1, where the tilt servo system 42 adjusts the tilt angle of the surface 50. Also, the focusing feedback control mechanism continues changing the value of the servo signal F until the servo signal F corresponds to the compensating amount DYt. As a result, the tilt angle of the surface 50 corresponding to the location S0 is adjusted to an estimation of the horizontal. Then, in step 216, the sled 32A carrying the pick-up head 32B returns to the standard location S0, where the servo signal F provided by the focusing feedback control mechanism becomes the standard servo signal F0. In FIG. 13, adjusting the surface 50 to the horizontal, the tilt servo system 42 should, in this case, move in the opposite direction (in FIG. 13, the direction is downward), so as to decrease the angle T to zero. Meanwhile, the tilt angle corresponding to the calibration location S1 (also the angle between the line Pb0 to Pb1 and the horizontal 52) becomes T1-T. Also, the vertical height of the surface 50 at the location S1 (compared with that at location S0) should be $DY1-T*DX1$, which is also the compensating amount DYt.

Figure 14:
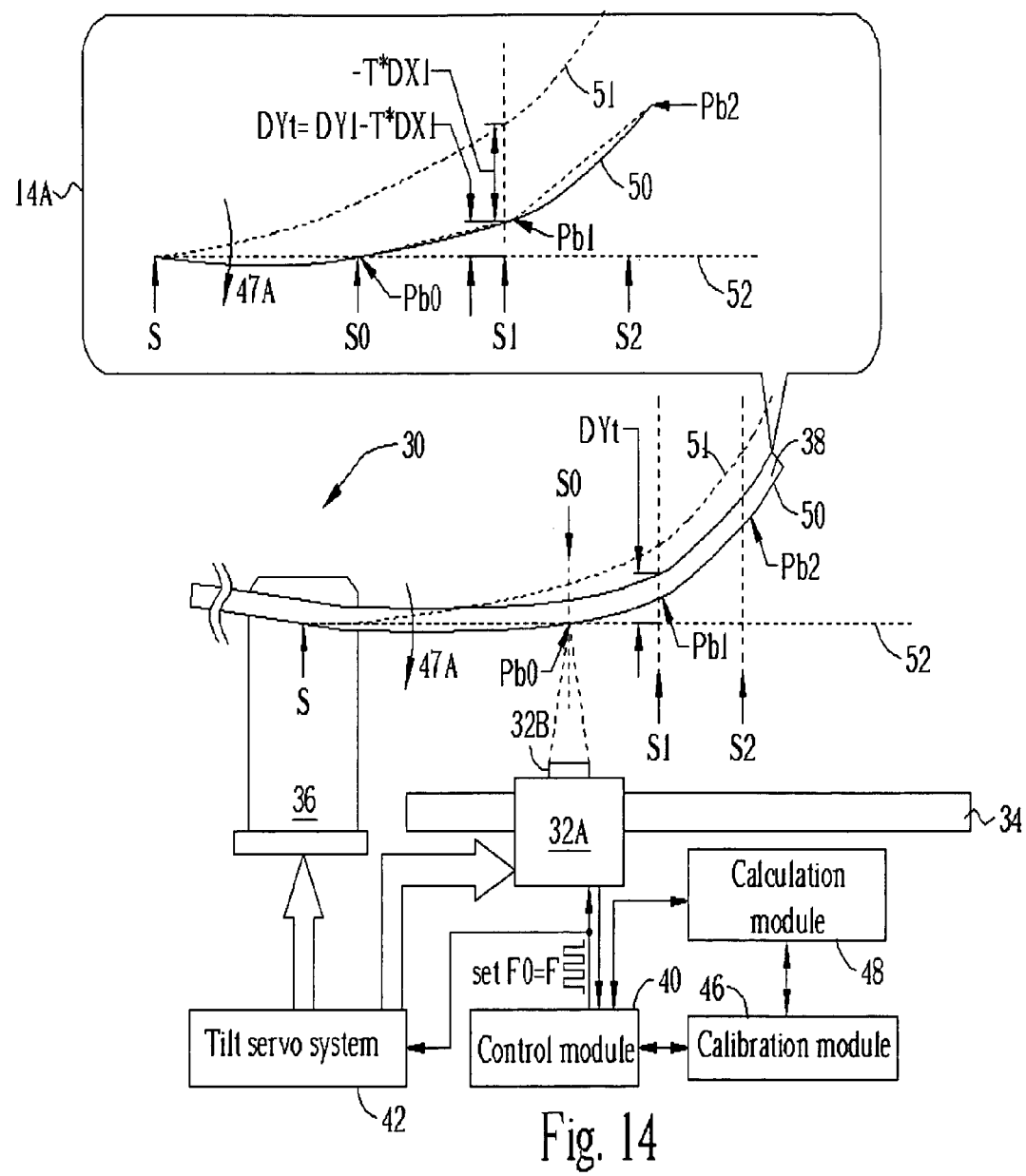
Figure 15:
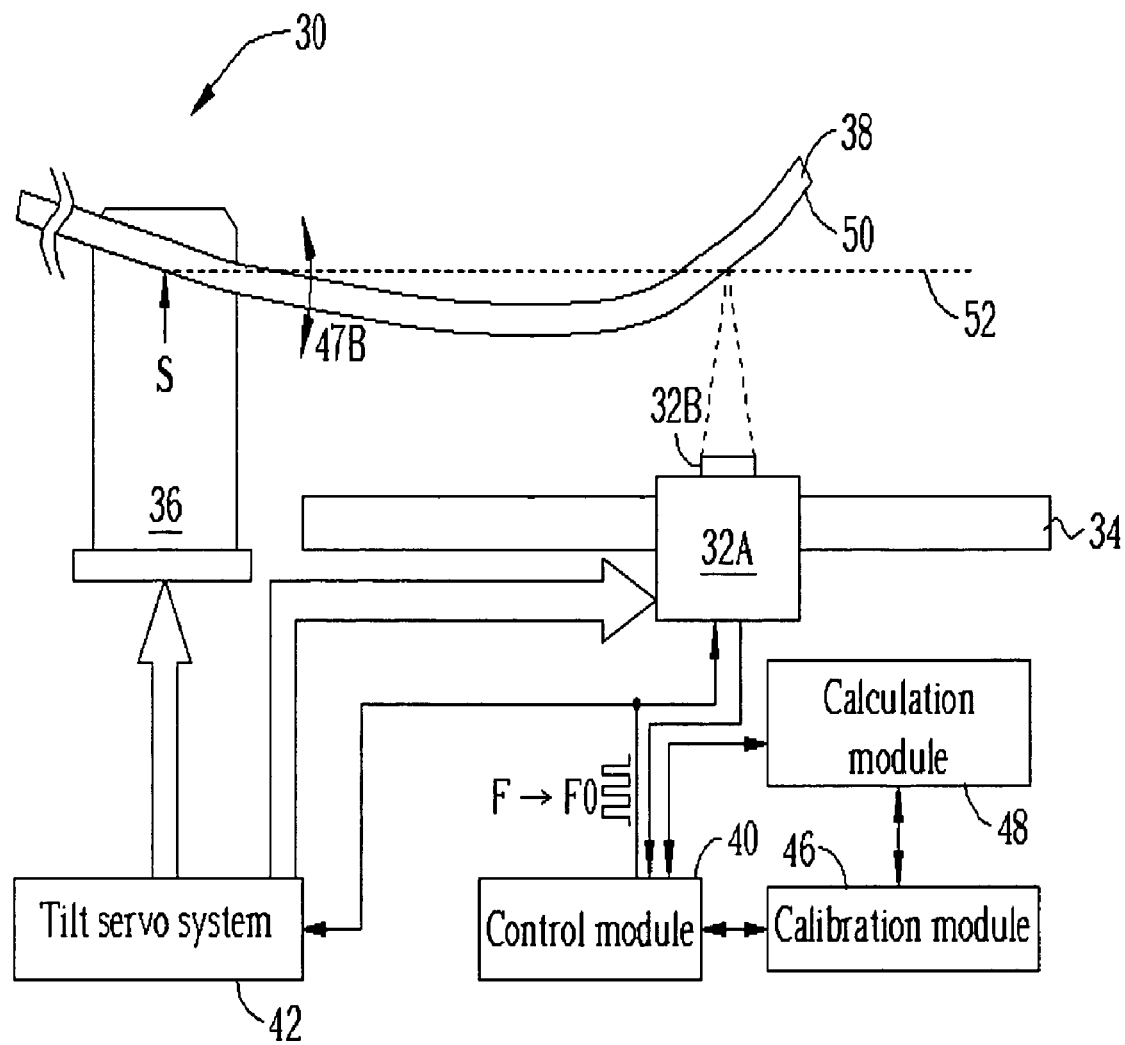
FIG. 15 illustrates a schematic diagram of the optical disk drive in FIG. 11 during tilt servo system operation.

As to the compensating amount DYt, please refer again to FIG. 14 (also FIG. 13). FIG. 13, FIG. 14 (and its inset graph 14A) illustrate schematic diagrams of steps 214 and 216, in which the tilt servo system 42 has already adjusted the surface 50 along an arrow 47A with the compensating amount DYt. For convenience, a dotted line 51 in FIG. 14 illustrates the surface 50 in FIG. 13 (the surface before adjustment). Compared with FIG. 14, in FIG. 13, the vertical position of the surface 50 at the location S1 (Pb1) with respect to the vertical position the surface 50 at the location S0 (Pb0) is the distance DY1, while in FIG. 14, the same dimension corresponds to the compensating amount DYt. In other words, when the tilt servo system 42 adjusts the surface 50 in step 214, process 200 determines if the surface 50 is horizontal according to the servo signal F at the calibration location S1 if equal to the compensating amount DYt, which is equal to DY1−T*DX1 in the case of FIG. 13, but equal to zero when the surface is a perfect plane. After step 214, and the surface 50 near the location S0 has been adjusted to the horizontal, so that, in step 216, when the sled 32A returns to the location S0, the focusing feedback control mechanism generates the standard servo signal F0 (as FIG. 14 illustrates). Then, process 200 carries out steps 218 and 220, where the tilt servo system 42 operates with the standard servo signal F0. Next, please refer to FIG. 15, which illustrates a schematic diagram of the tilt servo system 42 operating when the optical disk drive 30 in FIG. 11 accesses data. After calibrating/adjusting the standard servo signal F0, the tilt servo system 42 adjusts the tilt angle of the surface 50 during data access, to the end that the servo signal F is always close to the standard servo signal F0. That is, even if the surface 50 is bent/dished, the tilt servo system 42 still adjusts locations of the surface 50 corresponding to the horizontal position of the pick-up head 32B, to the horizontal according to the servo signal F if it (servo signal F) deviates from the standard servo signal F0.

Therefore, the physical models Tn=T+b*DXn of the present invention in FIG. 13 and FIG. 14 are directed toward consideration of surface bend. After the physical model is constructed based on tilt calibrations, the parameters of the physical model can be used to correct the compensating amount DYt (DYt=DY1−T*DX1) in step 212 (otherwise the amounts should be equal in steps 210 and 212). In comparison, the prior art assumes the surface is a perfect plane with equivalent tilt angles at different locations, so that the prior art cannot adequately accommodate surface bend.

Figure 16:
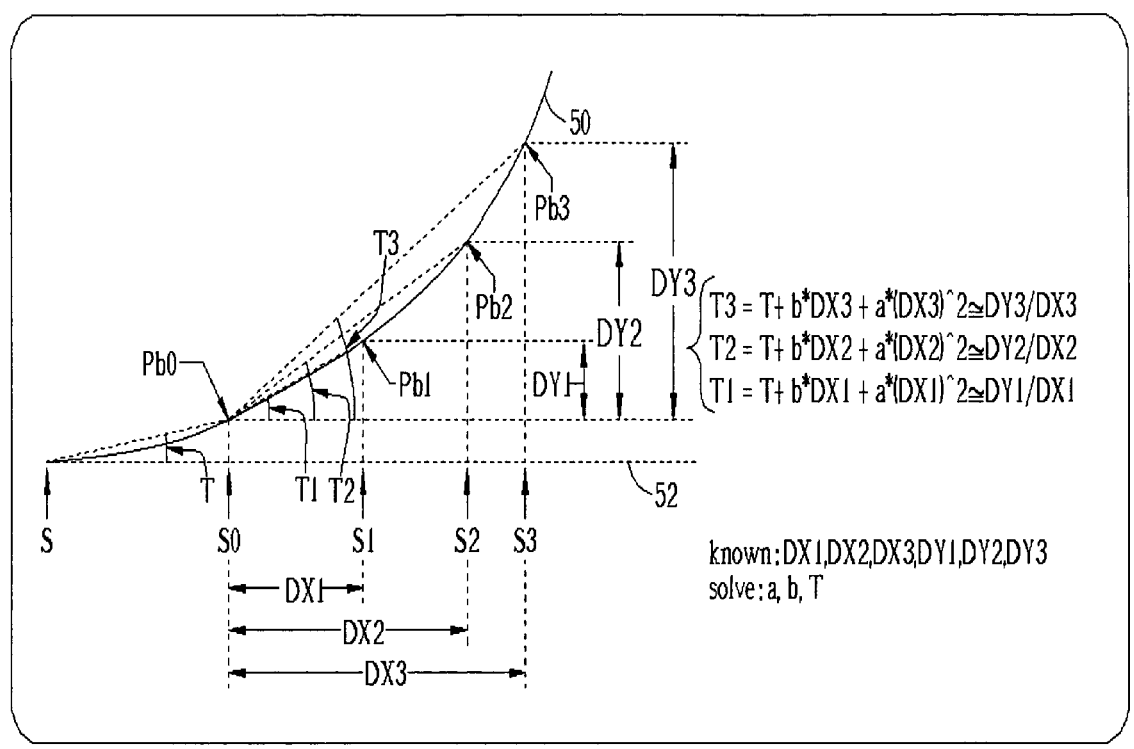
FIG. 16 and FIG. 17 illustrate schematic diagrams of the optical disk drive in FIG. 11 during the process in FIG. 12 with another physical model for a surface bend.
Figure 17:
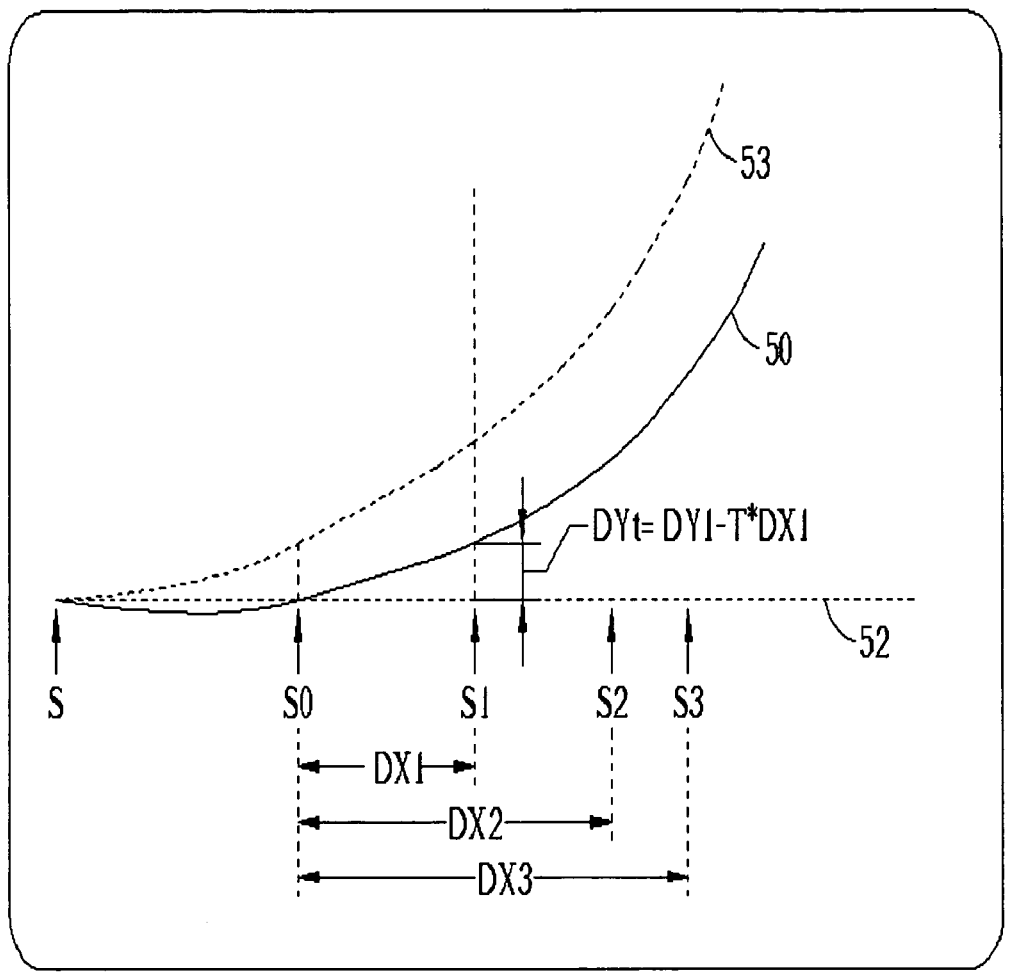

Other than embodiments of FIG. 13 and FIG. 14, the present invention can have another implementation if the optical disk drive 30 includes preferred operation resources, which can represent a bent surface with another physical model. In this case, please refer to FIG. 16 illustrating a schematic diagram of a physical model, which is provided by a two-dimensional polynomial between tilt angles and locations on the surface 50, or a formula: Tn=T+b*DXn+a*(DXn)^2, where T, b, a are unknown parameters. In order to calculate the three unknown parameters, process 200 includes calibrating three different calibration locations S1, S2, and S3 during step 204 (see FIG. 12). That is, calculating Tn=DYn/DXn for n=1 to 3 to construct a system of three equations, so as to solve the three unknown parameters of the physical model, and then the compensating amount DYt in step 212 can be obtained. Please refer to FIG. 16 and FIG. 17, which illustrate schematic diagrams of step 214. In step 214, the tilt servo system 42 adjusts the surface 50, so that near the standard location S0 it is corrected to an estimation of the horizontal (a dotted line 53 represents the surface 50 in FIG. 16). As with the previous embodiment, the vertical position of the surface 50 at the location S1 (Pb1) with respect to the vertical position of the surface 50 at the location S0 should be the compensating amount DYt, i.e. DY1−T*DX1.

Figure 18:
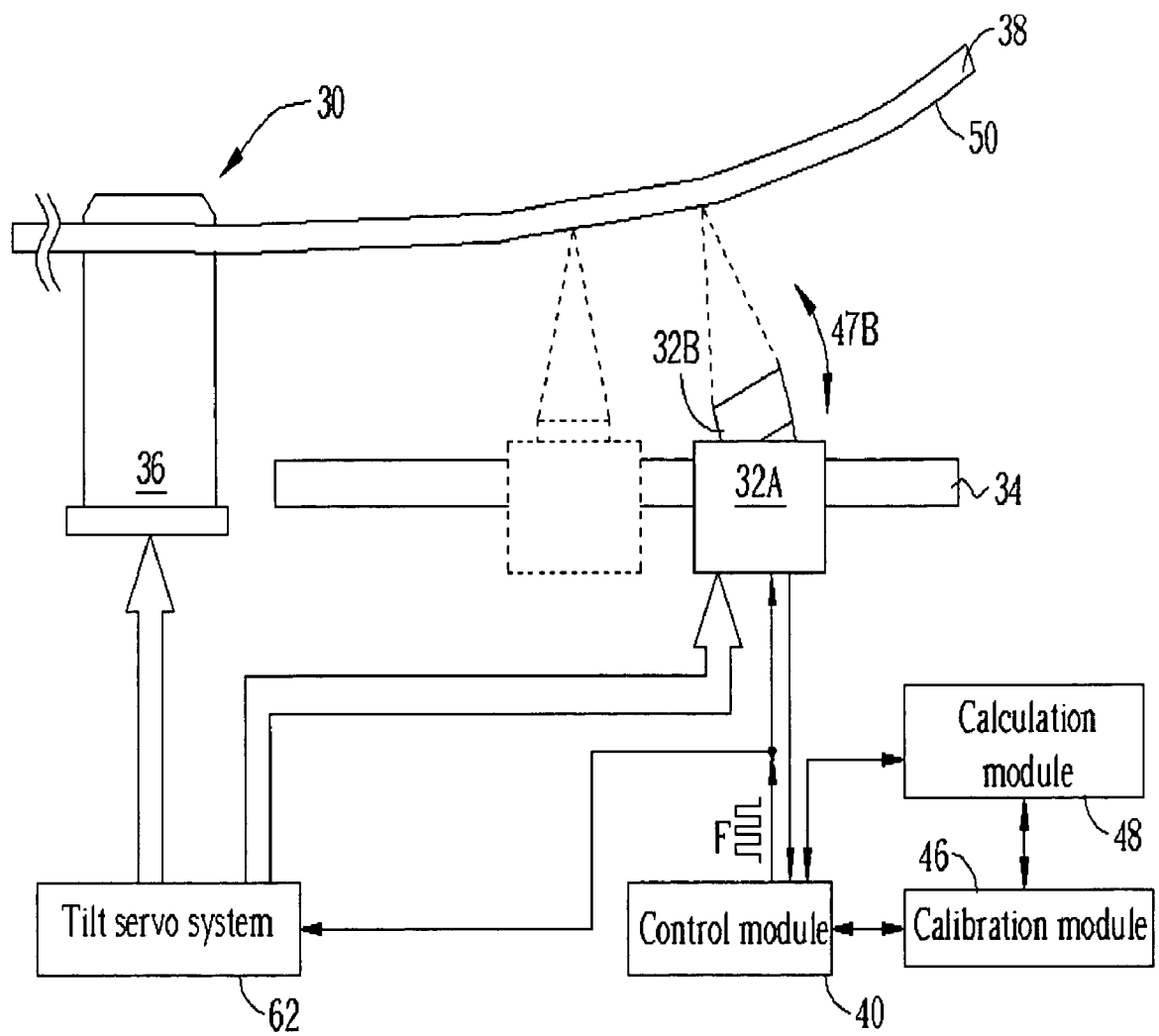
FIG. 18 illustrates a schematic diagram of the optical disk drive in FIG. 11 including an alternative type of tilt servo system.

In addition, the control module 40, the calibration module 46, and the calculation module 48 can be combined onto one chip. Although the embodiments in FIGS. 13, 14, 16, and 17 assume the surface 50 is bent upward, the present invention is also suitable for a downward bend. For example, if the physical models in FIGS. 13 and 14 simulate a downward surface bend, the parameter b should be negative, so that the tilt angle decreases as distance increases. Furthermore, in the embodiments of FIGS. 13, 14, 16, and 17, the pick-up head 32B is hypothetically parallel to the horizontal, and the tilt servo system 42 hypothetically adjusts the included angle between the surface and the pick-up head for tilt improvement. However, tilt servo systems of some optical disk drives can change the angle of the pick-up head 32B to adjust the included angle between the surface and the pick-up head, but the embodiments of the present invention are certainly suitable for this case. Please refer to FIG. 18. In FIG. 18, the optical disk drive 30 further includes another tilt servo system 62, which adjusts the direction of the pick-up head 32B along an arrow 47B with a special servomechanism, so as to adjust the relative angle of the pick-up head to the surface 50. The present invention is still able to fit this system for calibrating surface bend.

In summary, the prior art calibrates the tilt servo system under the assumption that the surface of the optical disk is a perfect plane, but the assumption is not always applicable to surfaces of optical disks, as they are generally bent or dished to some extent. Therefore, the prior art cannot calibrate the tilt servo system accurately, and further decreases the efficiency and correctness of data access. In comparison, the present invention adopts the physical model which can change the tilt angle adjustment of the surface as the location (radial position) changes, so that the calibration process can accurately set the standard servo signal for the tilt servo system to allow it to adjust the optical disk surface 18 during data access. As a result, accuracy and efficiency of data access in the optical disk drive can be promoted.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method and apparatus for calibrating an optical disk tilt servo system of an optical disk drive, the optical disk drive capable of focusing a laser beam on an optical disk and receiving a reflection; the method comprising:

setting a standard location and at least two calibration locations, the standard location and the calibration locations corresponding to different parts of the optical disk;

calibrating a focusing condition of the optical disk in the optical disk drive for generating a corresponding focusing result in the standard location and the calibration locations;

calculating different focusing results between each calibration location and the standard location; according to the different focusing results, estimating corresponding tilt angles between the surface of the optical disk and the calibration locations; and determining whether tilt angles corresponding to the calibration locations on the surface of the optical disk are equal.

2. The method of claim 1, wherein the optical disk drive further comprises a pick-up head for focusing the laser beam on the optical disk; the method further comprising:

if the corresponding tilt angles of different calibration locations in the surface are unequal, calculating a tilt compensation under a default physical model based on the corresponding tilt angle of each calibration location, adjusting the angle between the surface of the optical disk and a horizontal of the pick-up head according to the tilt compensation; wherein the physical model is that the surface of the optical disk has different tilt angles at different locations.

3. The method of claim 2, wherein the physical model sets a linear relation between the tilt angles of the surface in different locations and distances between the locations.

4. The method of claim 2 further comprising: after adjusting the angle between the surface of the optical disk and the horizontal based on the tilt compensation, measuring the focusing result of the standard location in the optical disk drive for generating a standard focusing result.

5. The method of claim 4 further comprising:
after generating the standard focusing result, during data access of the optical disk in the optical disk drive, continuously adjusting the angle between the surface of the optical disk and the horizontal, so that the focusing result of the optical disk in the optical disk drive is equal to the standard focusing result.

6. An optical disk drive comprising:
a pick-up head for focusing a laser beam on a optical disk and receiving a reflection signal;
a calibration module capable of setting a standard location and at least two calibration locations, each of the standard location and the calibration locations corresponding to different parts of the optical disk; the pick-up head capable of moving to the standard location and the calibration locations, and measuring focusing conditions of the optical disk in the optical disk drive for generating a corresponding focusing result; and
a calculation module for calculating different focusing results between each calibration location and the standard location, and estimating corresponding tilt angles between the surface of the optical disk and the calibration locations according to corresponding differences of each calibration location; the calculation module capable of determining whether the tilt angles of the calibration locations on the surface of the optical disk are equal.

7. The optical disk drive of claim 6, wherein if the corresponding tilt angles of different calibration locations on the surface are unequal, the calculation module calculates a tilt compensation under a default physical model based on the corresponding tilt angle of each calibration location, wherein the physical model is that the surface of the optical disk has different tilt angles at different locations; the optical disk drive further comprising a tilt servo system for adjusting the angle between the surface of the optical disk and a horizontal of the pick-up head according to the tilt compensation.

8. The optical disk drive of claim 7, wherein the physical model sets a linear relation between the tilt angles of the surface in different locations and distances between the locations.

9. The optical disk drive of claim 7, wherein after the tilt servo system adjusts the angle between the surface of the optical disk and the horizontal according to the tilt compensation, the calibration module measures the focusing result of the optical disk drive in the standard location for generating a standard focusing result.

10. The optical disk drive of claim 9, wherein when the optical disk drive accesses data on the optical disk with the pick-up head, the tilt servo system adjusts the angle between the surface of the optical disk and the horizontal according to the standard focusing result, so that the focusing result of the optical disk in the optical disk drive is equal to the standard focusing result.

* * * * *